(12) United States Patent
Murai

(10) Patent No.: US 7,291,520 B2
(45) Date of Patent: Nov. 6, 2007

(54) PIEZOELECTRIC ELEMENT AND LIQUID JET HEAD USING THE PIEZOELECTRIC ELEMENT

(75) Inventor: Masami Murai, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 10/517,840

(22) PCT Filed: Jun. 24, 2003

(86) PCT No.: PCT/JP03/07990

§ 371 (c)(1),
(2), (4) Date: Jul. 20, 2005

(87) PCT Pub. No.: WO04/001870

PCT Pub. Date: Dec. 31, 2003

(65) Prior Publication Data

US 2006/0051913 A1 Mar. 9, 2006

(30) Foreign Application Priority Data

Jun. 24, 2002 (JP) ............................. 2002-183512
Jun. 23, 2003 (JP) ............................. 2003-178799

(51) Int. Cl.
*H01L 21/00* (2006.01)
(52) U.S. Cl. .................... 438/150; 438/30; 438/187; 438/198
(58) Field of Classification Search ................ 438/30, 438/150, 187, 198; 257/415, 417, 418, 419
See application file for complete search history.

(56) References Cited

U.S. PATENT DOCUMENTS

| | | | |
|---|---|---|---|
| 5,650,810 A | 7/1997 | Muto | |
| 6,194,818 B1 * | 2/2001 | Sumi et al. | 310/311 |
| 6,336,717 B1 | 1/2002 | Shimada et al. | |
| 6,880,920 B2 * | 4/2005 | Murai | 347/70 |
| 6,900,579 B2 * | 5/2005 | Kanno et al. | 310/358 |
| 6,955,927 B2 * | 10/2005 | Murai | 438/3 |
| 2002/0071969 A1 * | 6/2002 | Qiu et al. | 428/697 |
| 2006/0207713 A1 * | 9/2006 | Eun et al. | 156/153 |

FOREIGN PATENT DOCUMENTS

| | | |
|---|---|---|
| JP | 2001-210888 A | 8/2001 |
| JP | 2002-43642 A | 2/2002 |
| JP | 2002-84012 A | 3/2002 |

* cited by examiner

*Primary Examiner*—Thao P. Le

(74) *Attorney, Agent, or Firm*—Sughrue Mion Pllc.

(57) ABSTRACT

Provided are a piezoelectric element and a liquid-jet head using the same, in which favorable crystallinity can be obtained with improved uniformity, breakage of a piezoelectric film can be prevented, thereby providing stable displacement properties. The piezoeletric element includes a lower electrode, a piezoelectric film formed on the lower electrode, and an upper electrode formed on the piezoelectric film. The piezoelectric film in turn includes a lower layer portion having column crystals, and an upper layer portion having column crystals which are continuous from those in the lower layer portion and having sizes larger than those in the lower layer portion.

6 Claims, 16 Drawing Sheets

(a)

(b)

(a)

(b)

(c)

(d)

(e)

(f)

(a)

(b)

(c)

(d)

(a)

(b)

(a)

(b)

(c)

(a)

(b)

(c)

(a)

(b)

(c)

(a)

(b)

(a)

(b)

(a)

(b)

PIEZOELECTRIC ELEMENT AND LIQUID JET HEAD USING THE PIEZOELECTRIC ELEMENT

This is a National Stage entry Application based on PCT/JP2003/007990, filed on Jun. 24, 2003. The entire disclosure of the prior application, application number PCT/JP2003/007990, is considered part of the disclosure of the present application and is hereby incorporated by reference.

TECHNICAL FIELD

The present invention relates to a piezoelectric element and a liquid jet head using the same, and particularly to a manufacturing method of the piezoelectric element, which can make a crystal orientation within a wafer surface uniform, thus making piezoelectric properties of the piezoelectric element uniform.

BACKGROUND ART

A piezoelectric element is an element in which a piezoelectric film, having an electromechanical transducing function, is sandwiched by two electrodes. The piezoelectric film is made of crystallized piezoelectric ceramics.

Conventionally, a so-called sol-gel method has been known as a manufacturing method of the piezoelectric element. Specifically, a sol of an organometallic compound is applied on a substrate in which a lower electrode is formed, and then the sol is dried and degreased to form a precursor film of a piezoelectric layer. After the steps of application, drying and degreasing of the sol is carried out predetermined times, the sol is subject to heat treatment at high temperature to be crystallized. In order to increase the thickness of the layer, the steps of application, drying and degreasing, as well as the step of crystallizing the sol are further carried out on the crystallized piezoelectric layer repeatedly.

A degreasing method using a tray dryer or a hot plate is known as a method of degreasing the above mentioned sol of the organometallic compound.

Further, this type of piezoelectric element is applied to a liquid jet head such as an ink-jet recording head. In the ink-jet recording head, a vibration plate constructs a part of each pressure generating chamber which communicates with a nozzle orifice for ejecting ink, and the vibration plate is deformed by the piezoelectric element to pressurize ink within the pressure generating chamber and thereby the ink droplets are ejected from the nozzle orifice. There are two types of ink-jet recording heads which are in practical use: the ink-jet recording head using a piezoelectric actuator in a longitudinal vibration mode where the actuator stretches and shrinks in an axis direction of the piezoelectric element; and the ink-jet recording head in a flexural vibration mode. The ink-jet recording head in the flexural vibration mode is typified by a known ink-jet recording head in which the piezoelectric elements are formed in the following manner: a uniform piezoelectric layer is formed over the entire surface of the vibration plate by a deposition technology; and the piezoelectric layer thus obtained is cut using a lithography method into pieces, each having a shape corresponding to each pressure generating chamber so that the piezoelectric elements are formed separately for the respective pressure generating chambers.

There is an example of the ink-jet recording head having the aforementioned piezoelectric element in the flexure vibration mode, which is disclosed in Japanese Patent Laid-Open Publication No. 2000-326503. In this ink-jet recording head, a lower electrode which constitutes the piezoelectric element is patterned in a region facing the pressure generating chamber, thus suppressing initial flexure of the vibration plate and increasing an amount of displacement of the vibration plate due to drive of the piezoelectric element.

In the conventional degreasing step in manufacturing the piezoelectric element, nucleuses of piezoelectric crystals in the precursor of the piezoelectric film has not been easily formed. Therefore, it has been difficult to obtain desired crystals when the precursor is crystallized. Moreover, degreasing conditions have varied due to, for example, variations in a rate of temperature increase depending on a position within the wafer surface. This could result in variations in crystal orientations and piezoelectric properties.

Moreover, when forming the piezoelectric film on the lower electrode which is patterned as mentioned earlier, a problem arises that portions of the piezoelectric film formed to cover edges of the lower electrode and other portion of the same formed on the outer sides of the lower electrode have poor film qualities, and thereby a drive reliability of the piezoelectric element is degraded. In other words, the piezoelectric film on the lower electrode and the same on the outer sides of the lower electrode have different properties of crystals and the like. Thus, the piezoelectric layer is substantially discontinuous in the vicinities of edges of the lower electrode thereby causing breakage such as a crack in the piezoelectric film when a voltage is applied thereto. This breakage easily happens particularly in the piezoelectric film in the region corresponding to the edges of the lower electrode in a longitudinal direction thereof.

DISCLOSURE OF THE INVENTION

In consideration of the foregoing circumstances, it is an object of the present invention to provide a piezoelectric element in which desired and favorable crystallinity is obtained with improved uniformity thereof and breakage of a piezoelectric film is prevented to obtain stable displacement properties, a liquid jet head using the piezoelectric element, and a manufacturing method thereof.

The first aspect of the present invention for solving the aforementioned problems is a manufacturing method of a piezoelectric element including the steps of forming a lower electrode on a substrate, forming a piezoelectric film on the lower electrode, and forming an upper electrode on the piezoelectric film. In the step of forming the piezoelectric film, steps of forming a piezoelectric layer are carried out a plurality of times, whereby a plurality of the piezoelectric layers are stacked, the steps of forming the piezoelectric layer including applying a sol containing an organometallic compound, drying the sol containing the organometallic compound, degreasing the sol containing the organometallic compound so that the sol is gelated, and crystallizing the gelated organometallic compound. Moreover, when forming a lowermost layer of the piezoelectric layers, a rate of temperature increase during at least initial degreasing thereof is set to 500° C./min or lower.

In the first aspect, when the lowermost layer of the piezoelectric layers is formed, the rate of temperature increase while degreasing is maintained relatively low, thus forming a number of small seed crystals within the lowermost layer of the piezoelectric layers. Thus, the piezoelectric film with a favorable film quality can be formed.

The second aspect of the present invention is characterized by that, in the manufacturing method of a piezoelectric element according to the first aspect, when forming at least one layer of the piezoelectric layers except for the lowermost layer, the rate of temperature increase during degreasing thereof is set to be 1000° C./min or higher.

In the second aspect, crystals grow from the nucleuses of piezoelectric crystals which are previously crystallized. Therefore, the crystals of the piezoelectric film are prevented from being discontinuous.

In the third aspect of the present invention, a manufacturing method of a piezoelectric element includes the steps of forming a lower electrode on a substrate, forming a piezoelectric film on the lower electrode, and forming an upper electrode on the piezoelectric film. In the step of forming the piezoelectric film, steps of forming a piezoelectric layer are carried out a plurality of times, whereby a plurality of the piezoelectric layers are stacked, the steps of forming the piezoelectric layer including applying a sol containing an organometallic compound, drying the sol containing the organometallic compound, degreasing the sol containing the organometallic compound so that the sol is gelated, and crystallizing the gelated organometallic compound, When forming a lowermost layer of the piezoelectric layers, a rate of temperature increase during at least initial degreasing thereof is set to be equal to or lower than that during degreasing of the other piezoelectric layers.

In the third aspect, when the lowermost layer of the piezoelectric layers is formed, the rate of temperature increase while degreasing is maintained low, thus forming a number of small seed crystals within the lowermost layer of the piezoelectric layers. Thus, the piezoelectric film with a favorable film quality can be formed.

The fourth aspect of the present invention is a manufacturing method of a piezoelectric element according to the third aspect of the present invention in which, the step of forming the piezoelectric film includes: forming a first piezoelectric layer, which is the lowermost layer of the piezoelectric layers, on the lower electrode provided over an almost entire surface of the substrate; patterning the lower electrode and the first piezoelectric layer to have a predetermined shape; and forming another piezoelectric layer to cover end surfaces of the lower electrode and the first piezoelectric layer. The rate of temperature increase during degreasing for forming the first piezoelectric layer and a second piezoelectric layer provided immediately on the first piezoelectric layer is set to be equal to or lower than that during degreasing for forming the rest of piezoelectric layers.

In the fourth aspect, the film quality of the piezoelectric film, especially of the piezoelectric film on edges and outer sides of the lower electrode, is improved.

The fifth aspect of the present invention is a manufacturing method of a piezoelectric element according to the fourth aspect of the present invention, in which each of the first and second piezoelectric layers are formed by applying a sol containing the organometallic compound once, followed by gelation and crystallizing the sol, and the rest of the piezoelectric layers are formed by applying the sol containing the organometallic compound twice or more, followed by gelation and crystallization of the sol.

In the fifth aspect, the film quality of the piezoelectric film is improved, and efficiency in manufacturing the same is also improved.

The sixth aspect of the present invention is a manufacturing method of a piezoelectric element according to any one of fourth and fifth aspects of the present invention, in which after the lower electrode and the first piezoelectric layers are patterned, crystal seeds which become nucleuses of the piezoelectric film are continuously formed from the first piezoelectric layer through outer sides thereof.

In the sixth aspect, the second piezoelectric layer has a crystal structure which orients in one direction by virtue of the crystal seeds and is thus formed approximately uniformly. Therefore, the film quality of the piezoelectric film is surely improved.

The seventh aspect of the present invention is a manufacturing method of a piezoelectric element according to any one of fourth to sixth aspect of the present invention, in which the lower electrode and the first piezoelectric layer are patterned by ion milling.

In the seventh aspect, the lower electrode and the first piezoelectric layer can be patterned to have a desired shape relatively easily.

The eighth aspect of the present invention is a manufacturing method of a piezoelectric element, including the steps of forming a lower electrode on a substrate, forming a piezoelectric film on the lower electrode, and forming an upper electrode on the piezoelectric film. In the step of forming the piezoelectric film, steps of forming a piezoelectric layer are carried out a plurality of times, whereby a plurality of the piezoelectric layers are stacked, the steps of forming the piezoelectric layer including applying a sol containing an organometallic compound, drying the sol containing the organometallic compound, degreasing the sol containing the organometallic compound so that the sol is gelated, and crystallizing the gelated organometallic compound. The rate of temperature increase during degreasing of at least the piezoelectric layer formed by initial crystallizing is set to be equal to or lower than that during degreasing for the rest of piezoelectric layers formed by following crystallization.

In the eighth aspect, when forming a lower layer of the piezoelectric layers, the rate of temperature increase while degreasing is maintained relatively low, thus forming a number of small seed crystals within the piezoelectric layer. Consequently, the piezoelectric film with a favorable film quality can be formed.

The ninth aspect of the present invention is a manufacturing method of a piezoelectric method according to any one of first to eighth aspects in which when the degreasing is performed, the sol is heated from a side of the substrate.

In the ninth aspect, heating can be performed under relatively uniform temperature conditions, making it possible to perform uniform and efficient degreasing.

The tenth aspect of the present invention is a manufacturing method of a liquid jet head, in which a piezoelectric element made in the manufacturing method of any one of the first to ninth aspects is used.

In the tenth aspect, since ejection properties are improved and also become uniform, the liquid-jet head with improved reliability is realized relatively easily.

The eleventh aspect of the present invention is a piezoelectric element which includes a lower electrode, a piezoelectric film formed on the lower electrode, and an upper electrode formed on the piezoelectric film. The piezoelectric film includes a lower layer portion having column crystals, and an upper layer portion having column crystals which are continuous from those in the lower layer portion and have sizes larger than those in the lower layer portion.

In the eleventh aspect, the film quality of the piezoelectric film, such as crystallinity thereof, is improved and also becomes uniform.

The twelfth aspect of the present invention is a piezoelectric element according to the eleventh aspect of the present invention, in which the lower electrode is patterned to have a predetermined shape, a first piezoelectric layer, which is a lowermost layer of a plurality of piezoelectric layers constructing the piezoelectric film, is formed only on the lower electrode, and the rest of the piezoelectric layers are formed, covering end faces of the lower electrode and the first piezoelectric layer. The first piezoelectric layer and a second piezoelectric layer are formed directly on the first piezoelectric layer construct the lower layer portion.

In the twelfth aspect, the film quality of the piezoelectric film, such as crystallinity thereof, is improved. Particularly, the film quality of the piezoelectric film on end faces and the outer sides of the lower electrode is improved and thereby favorable piezoelectric properties can be obtained.

The thirteenth aspect of the present invention is a piezoelectric element according to the twelfth aspect of the present invention, in which a thickness of each of the first and second piezoelectric layers is thinner than that of each of the rest of the piezoelectric layers.

In the thirteenth aspect, the film quality of the piezoelectric film is more surely improved.

The fourteenth aspect of the present invention is a piezoelectric element according to any one of the twelfth and the thirteenth aspects of the present invention, in which the end faces of the lower electrode and the first piezoelectric layer are inclined at a predetermined angle with respect to surfaces thereof.

In the fourteenth aspect, the film qualities of the second piezoelectric layer and the like formed immediately on the lower electrode and the first piezoelectric layer are improved, thus preventing a crack or the like in the piezoelectric film by voltage application.

The fifteenth aspect of the present invention is a piezoelectric element according to any one of twelfth to fourteenth aspects of the present invention, in which metallic layers, which are electrically disconnected from the lower electrode, are provided in vicinities of edges of the piezoelectric film.

In the fifteenth aspect, the piezoelectric layer is formed by being crystallized under approximately uniform heating conditions, and thereby the piezoelectric film with favorable film quality can be obtained.

The sixteenth aspect of the present invention is a liquid-jet head, including the piezoelectric element according to any one of eleventh to fifteenth aspects of the present invention as a driving source of liquid ejection.

In the sixteenth aspect, ejection properties are improved and also become uniform, thus realizing the liquid jet head with improved reliability.

BEST MODE FOR CARRYING OUT THE PRESENT INVENTION

Embodiments of the present invention will be described below with reference to the drawings.

Embodiment 1

Figure 1:
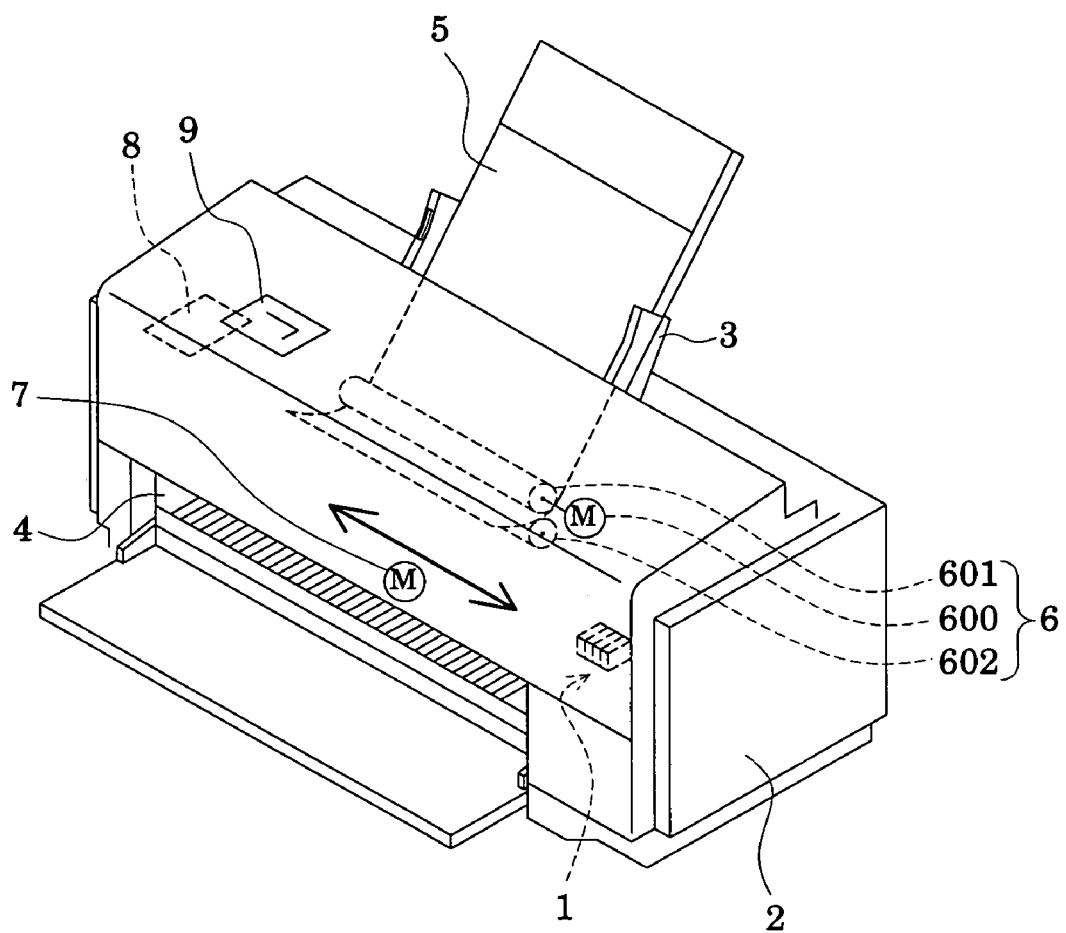
FIG. 1 is an explanatory view of a construction of a printer according to Embodiment 1.

FIG. 1 is an explanatory view of a construction of a printer (an example of a liquid jet device) using an ink-jet recording head (an example of a liquid jet head) which is provided with a piezoelectric element manufactured in a method of this embodiment. This printer is provided with a body 2, a tray 3, a discharge port 4 and an operation panel 9. In addition, the ink-jet recording head 1, a feeding mechanism 6 and a control circuit 8 are provided within the body 2.

The ink-jet recording head 1 is provided with the piezoelectric element manufactured in the manufacturing method of the present invention. The ink-jet recording head 1 is constructed to be able to eject ink, which is a liquid, from a nozzle in accordance with an ejection signal supplied from the control circuit 8.

The body 2 is a casing of the printer, in which the feeding mechanism 6 is placed at the position where paper 5 can be fed from the tray 3, and the ink-jet recording head 1 is placed to be able to print the paper 5. The tray 3 is constructed so that the paper 5 before being printed can be fed into the feeding mechanism 6. The discharge port 4 is an exit where the paper 5 after being printed is discharged.

The feeding mechanism 6 is provided with a motor 600, rollers 601 and 602, and other unillustrated mechanical construction. The motor 600 can rotate in accordance with the drive signal supplied by the control circuit 8. The mechanical construction is configured to be able to transfer rotation force of the motor 600 to the rollers 601 and 602. The rollers 601 and 602 rotate when the rotation force of the motor 600 is transferred thereto. The paper 5 put on the tray 3 is then drawn by the rotation of the motors 601 and 602 and fed to be printed by the head 1.

The control circuit 8 is provided with a CPU, a ROM, a RAM, an interface circuit and the like, which are not shown. The control circuit 8 can supply a drive signal and an ejection signal to the feeding mechanism 6 and the ink-jet recording head 1, respectively, in accordance with printing information supplied by a computer through an unillustrated connector. In addition, the control circuit 8 can set an operation mode and perform reset processing and the like in accordance with an operation signal from the operation panel 9.

Figure 2:
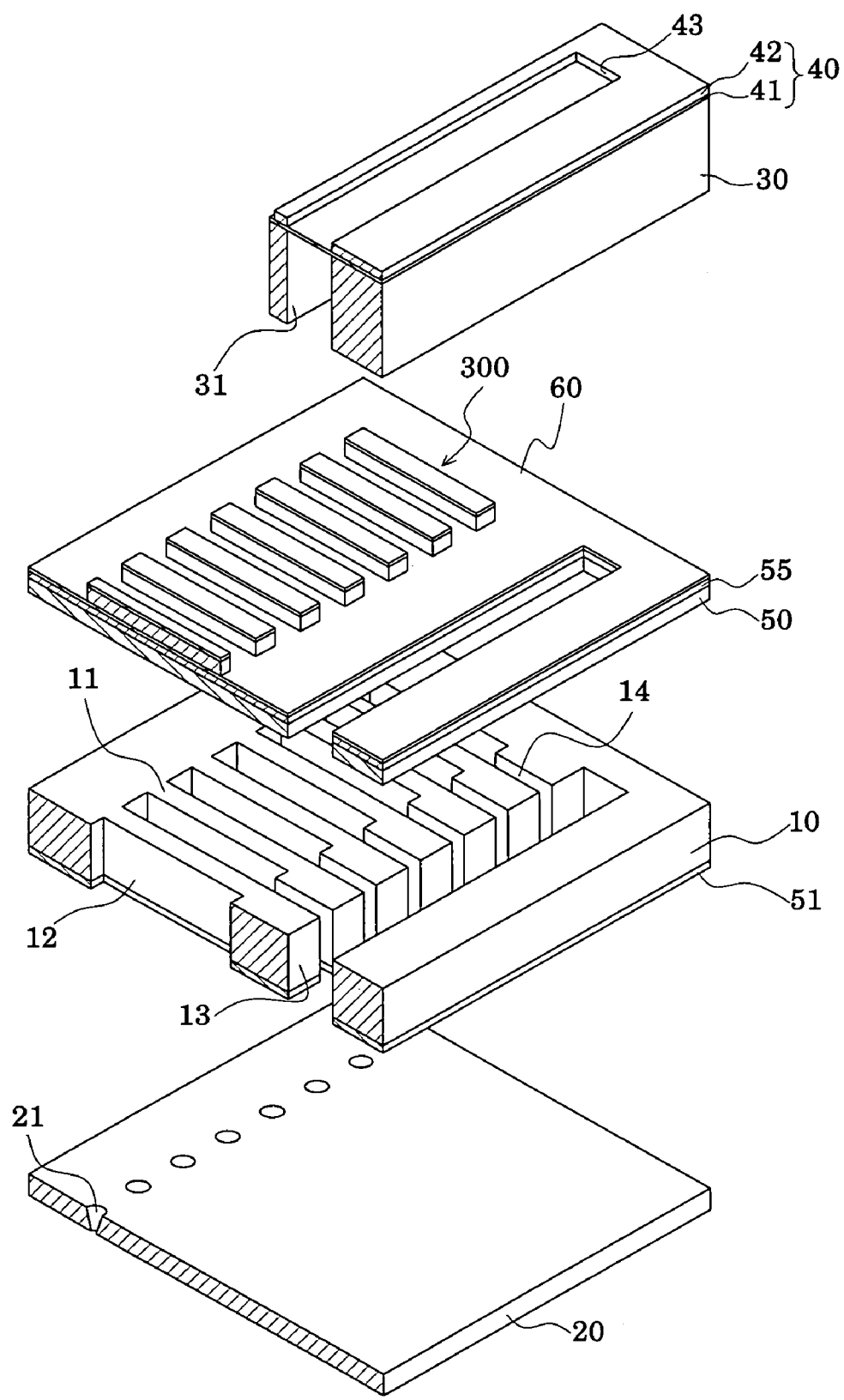
FIG. 2 is an exploded perspective view schematically showing a recording head according to Embodiment 1.
Figure 3:
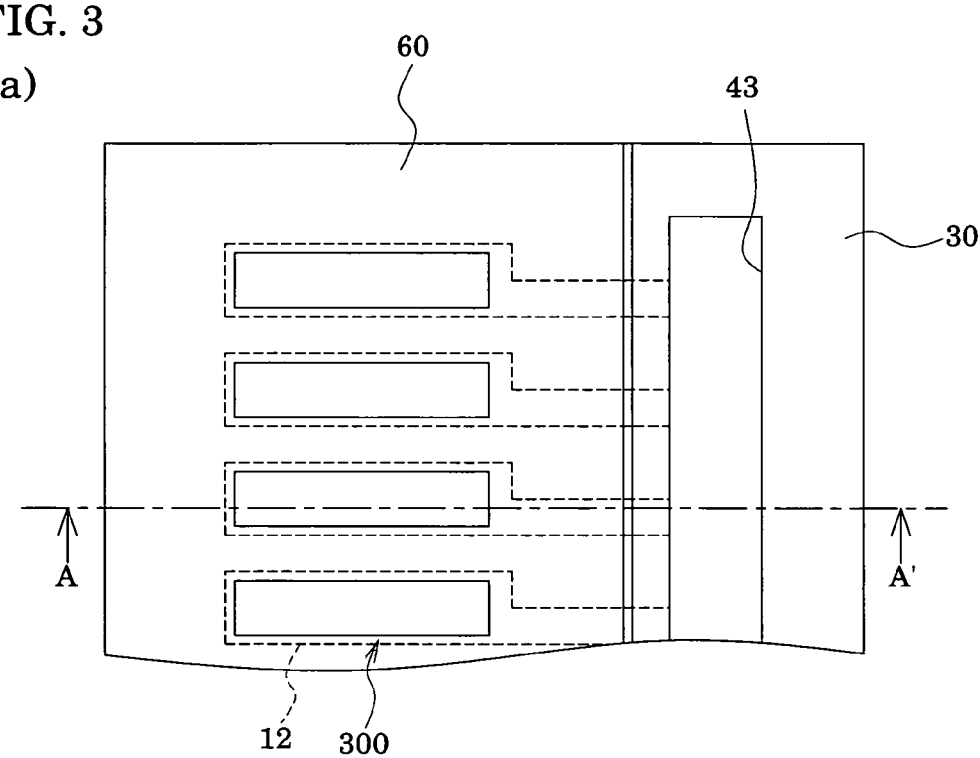
FIGS. 3(a) and 3(b) are a plan view and a cross-sectional view, respectively, of the recording head according to Embodiment 1.
Figure 3:
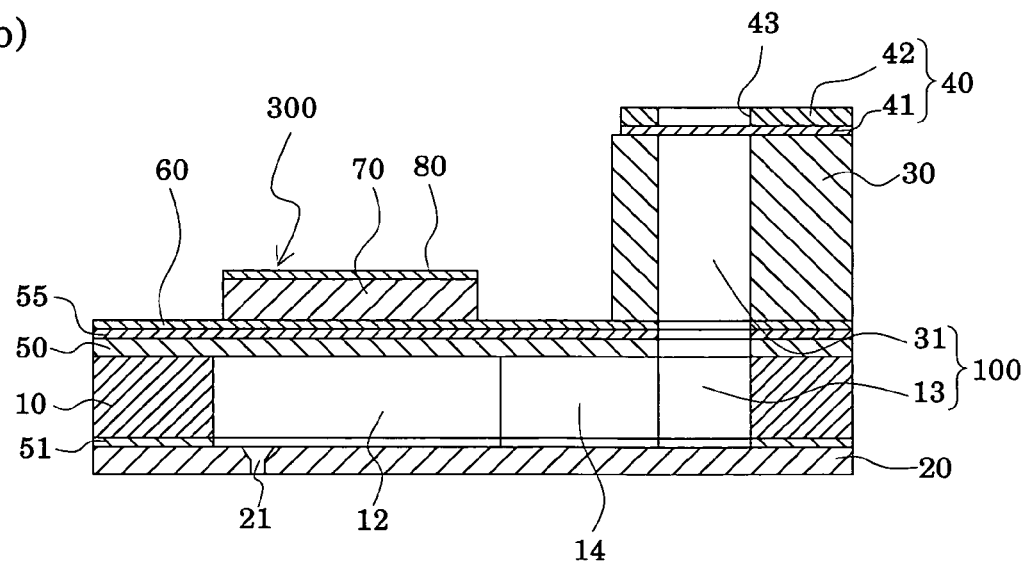
Figure 4:
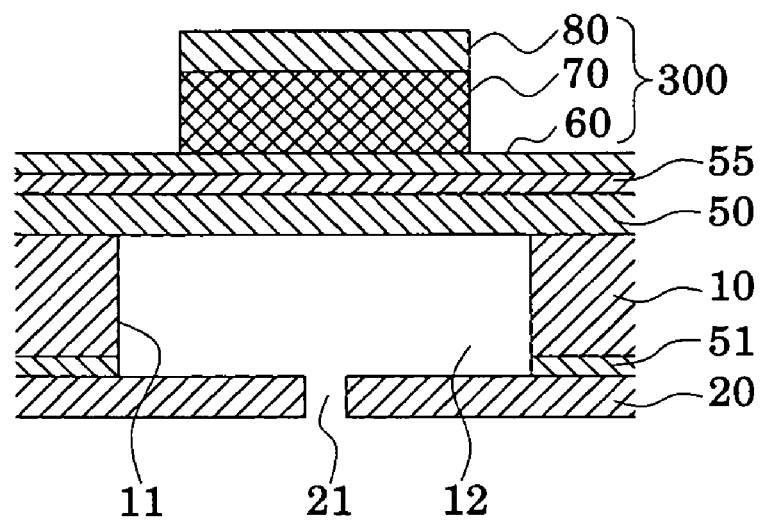
FIG. 4 is a schematic cross-sectional view showing a layer construction of a piezoelectric element according to Embodiment 1.

Next, a construction of the ink-jet recording head mounted on this type of printer is described. FIG. 2 is an exploded perspective view schematically showing the ink-jet recording head according to Embodiment 1 of the present invention. FIG. 3(*a*) is a plan view of FIG. 2 and FIG. 3(*b*) is a cross-sectional view taken along the like A-A'. FIG. 4 is a schematic cross-sectional view showing a layer construction of the piezoelectric element.

As illustrated, a passage-forming substrate 10 in this embodiment is made of a single crystal silicon substrate with a plane orientation (110). On one side of the passage-forming substrate 10, an elastic film 50 is formed. The elastic film 50 has a thickness of 1 to 2 μm and is made of silicon dioxide which is previously formed by thermal oxidization. In the passage-forming substrate 10, a plurality of pressure generating chambers 12 are arrayed side by side in a width direction of the pressure generating chamber 12. In addition, a communicating portion 13 is formed in the passage-forming substrate 10 in a longitudinal outer region of the pressure generating chambers 12. The communicating portion 13 and each of the pressure-generating chambers 12 communicate with each other through ink supply paths 14, respectively. Note that the communicating portion 13 communicates with a reservoir portion 31 of a later described reservoir forming plate 30, constructing a part of a reservoir 100 which is a common ink chamber for each of the pressure generating chambers 12. Each of the ink supply paths 14 is formed to have a narrower width than that of each of the pressure generating chambers 12, thereby maintaining uniform flow resistance of the ink flown into the pressure generating chamber 12 from the communicating portion 13.

Note that it is preferred to select an appropriate thickness of the passage-forming substrate 10 in which the pressure generating chambers 12 and the like are formed, depending on density of pressure generating chambers 12 provided therein. For example, in the case of arraying about 180 pressure generating chambers 12 per inch (180 dpi), the thickness of the passage-forming substrate 10 is preferably set to about 180 to 280 μm, and more preferably about 220 μm. Moreover, in the case of arraying the pressure generating chambers 12, for example, as relatively densely as about 360 dpi, the thickness of the passage-forming substrate 10 is preferably set to 100 μm or smaller. This is because the array density of the pressure generating chambers 12 can be increased while maintaining rigidity of the compartment walls 11 between the pressure generating chambers 12 neighboring each other.

Moreover, a nozzle plate 20 having nozzle orifices 21 drilled therethrough is fixed to the open face side of the passage-forming substrate 10 through an adhesive, a thermowelding film or the like. These nozzle orifices 21 communicate with the vicinities of ends of the pressure-generating chambers 12 on the opposite side of the ink supply paths 14. Note that the nozzle plate 20 has a thickness of, for example, 0.1 to 1 mm and made of glass ceramics, a single crystal silicon substrate, stainless steel, or the like whose coefficient of linear expansion is, for example, 2.5 to 4.5 [$\times 10^{-6}$/C.°] at temperature of 300C.° or lower.

Meanwhile, as shown in FIG. 4, the elastic film 50 with a thickness of, for example, about 1.0 μm is formed on the passage-forming substrate 10 on the side opposed to the open face thereof. On the elastic film 50, an insulation film 55 with a thickness of, for example, about 0.4 μm is formed. On the insulation film 55, a lower electrode film 60 with a thickness of, for example, about 0.2 μm, a piezoelectric layer 70 with a thickness of, for example, about 1.0 μm and an upper electrode film 80 with a thickness of, for example, about 0.05 μm are further stacked in a process to be described later, thus configuring each piezoelectric element 300. Here, the piezoelectric element 300 corresponds to a portion including the lower electrode film 60, the piezoelectric layer 70 and the upper electrode film 80. Generally, in each of the piezoelectric elements 300, any one of the electrodes thereof is used as a common electrode, and the other electrode and the piezoelectric layer 70 are patterned for each of the pressure-generating chambers 12. Consequently, here, a portion where piezoelectric strain occurs due to voltage application to both of the electrodes is called a piezoelectric active portion, which is configured by any one of the electrodes and the piezoelectric layer 70 which are patterned. In this embodiment, in each of the piezoelectric elements 300, the lower electrode film 60 is used as the common electrode thereof, and the upper electrode film 80 is used as a separately provided electrode thereof. However, no problem arises even when the lower and upper electrodes 80 and 60 are used in the other way around, for convenience of a drive circuit and wiring. In any of above cases, the piezoelectric active portion is formed for each of the pressure generating chambers. Moreover, herein, the piezoelectric elements 300 and the vibration plate displaced by drive of the piezoelectric elements 300 are collectively called a piezoelectric actuator.

Here, the lower electrode film 60 in this embodiment is formed in the same region as the insulation film 55 so as to function as the common electrode of the plurality of the piezoelectric elements 300 formed on the passage-forming substrate 10. The lower electrode film 60 also acts as the vibration plate. It is preferred that a material of the lower electrode film 60 be a conductive material, for example, platinum, iridium and the like. This is because the piezoelectric film 70, deposited by a spattering or sol-gel method described later, needs to be baked for crystallization at a temperature from about 600 to 1000° C. in an atmosphere of air or oxygen.

Moreover, the composition of the piezoelectric film 70 maybe, for example, that of piezoelectric ceramics such as lead zirconate titanate (Pb (Zr$_{0.56}$, Ti$_{0.44}$) O$_3$: PZT). Alternatively, lead lanthanum titanate ((Pb, La) TiO$_3$), lead lanthanum zirconate ((Pb, La) ZrO$_3$), lead magnesium niobate-lead zirconate titanate (Pb (Mg, Nb) (Zr, Ti) O$_3$: PMN-PZT), barium zirconate titanate (Ba (Zr, Ti) O$_3$: BZT) and the like may be used. Further, the material of the upper electrode film 80 is not particularly limited as long as it is conductive. In this embodiment, iridium (Ir), for example, is used for the upper electrode film 80.

The reservoir forming plate 30 having a reservoir portion 31 is joined onto the passage-forming substrate 10 in which the foregoing piezoelectric elements 300 are formed. The reservoir portion 31 constructs at least a part of the reservoir 100 which is a common ink chamber for each of the pressure generating chambers 12. In addition, a compliance plate 40 which includes a sealing film 41 and a fixed plate 42 is joined onto the reservoir forming plate 30. The sealing film 41 is made of a flexible material with low rigidity and the fixed plate 42 is formed using a hard material such as metal. The fixed plate 42 is entirely removed in a thickness direction thereof in the region facing the reservoir 100, thus forming an opening portion 43. Consequently, one side of the reservoir 100 is sealed only by the sealing film 41.

The foregoing ink-jet recording head in this embodiment takes in ink from unillustrated external ink supply means and the inside of the recording head, from the reservoir 100 through the nozzle orifices 21, is filled with the ink. Thereafter, in accordance with a recording signal from an unillustrated drive circuit, a voltage is applied through external wiring between the lower and upper electrode films 60 and 80, respectively corresponding to the pressure-generating chambers 12. The elastic film 50, the insulation film 55, the lower electrode film 60 and the piezoelectric layer 70 are then flexurally deformed. Thus, pressure in each of the pressure-generating chambers 12 is increased and ink droplets are ejected from the nozzle orifices 21.

Figure 5:
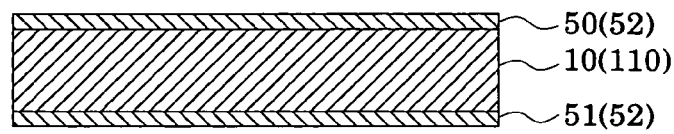
FIGS. 5(a) to 5(f) are cross-sectional views of the recording head, showing manufacturing steps thereof according to Embodiment 1.
Figure 5:
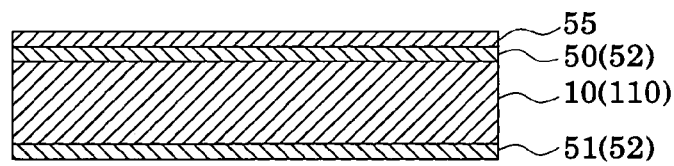
Figure 5:
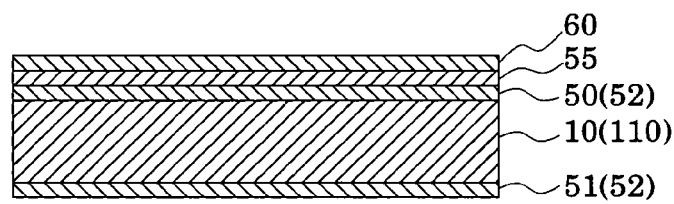
Figure 5:
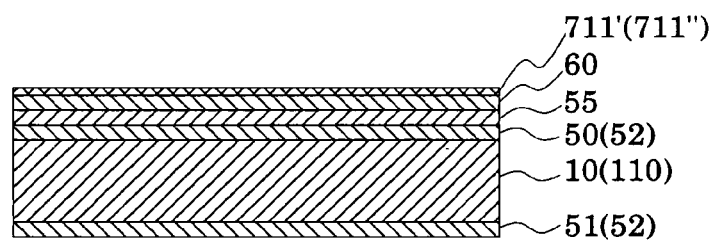
Figure 5:
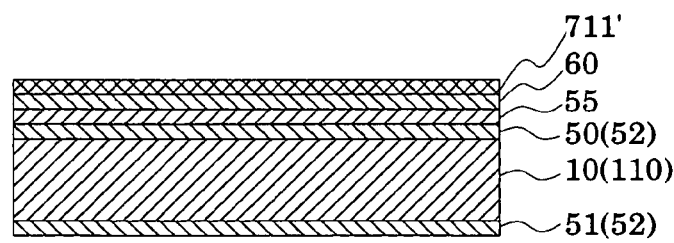
Figure 5:
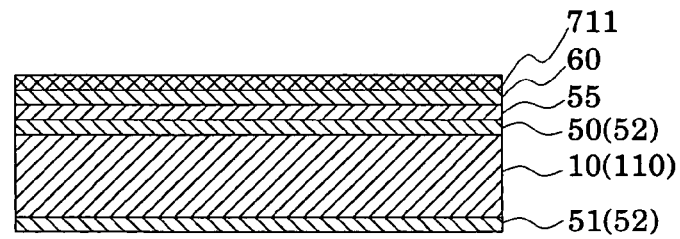
Figure 6:
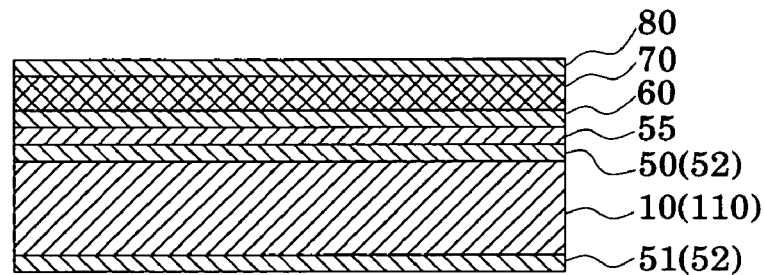
FIGS. 6(a) to 6(d) are cross-sectional views of the recording head, showing manufacturing steps thereof according to Embodiment 1.
Figure 6:
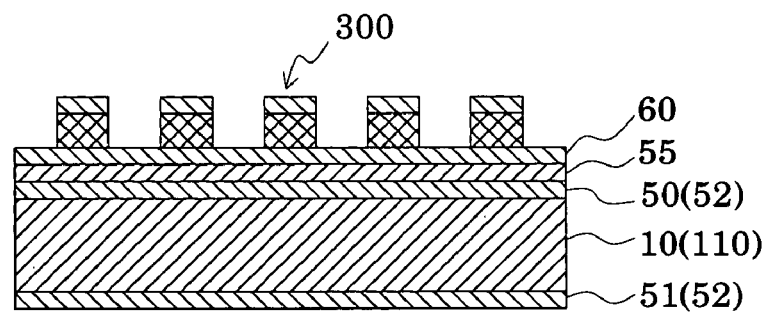
Figure 6:
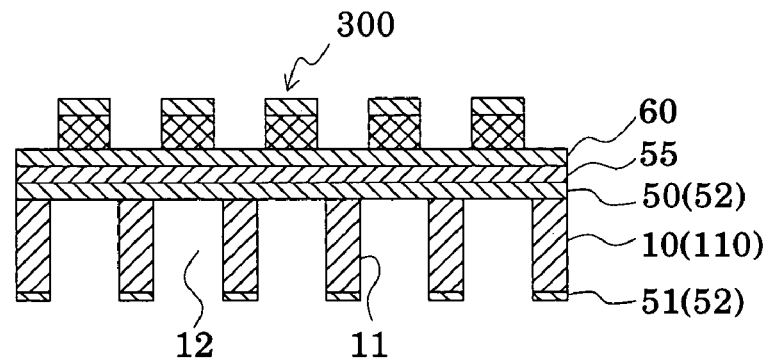
Figure 6:
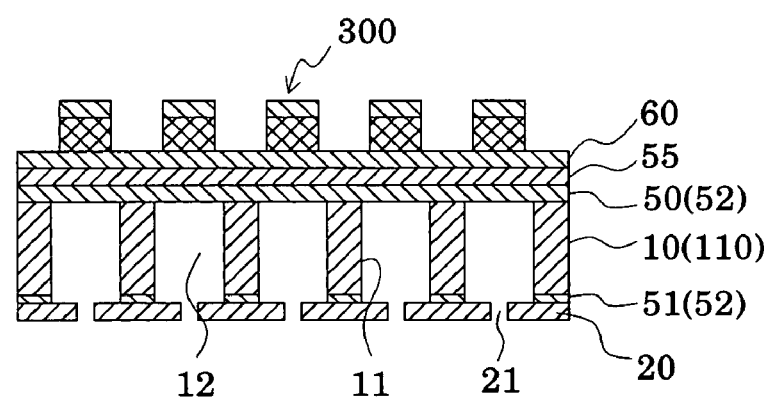

Description will be given below regarding a manufacturing method of the foregoing ink-jet recording head according to this embodiment, particularly a manufacturing method of the piezoelectric element, with reference to FIGS. 5(a) to FIG. 7. First of all, as shown in FIG. 5(a), a silicon wafer 110 which acts as the passage-forming substrate 10 is thermally oxidized in a diffusion furnace at temperature of 1100° C. to form silicon dioxide films 52 constructing the elastic film 50 and a mask film 51, respectively, over both the upper and lower surfaces of the silicon wafer 110. Next, as shown in FIG. 5(b), a zirconium (Zr) layer is formed on the elastic film 50 (silicon dioxide film 52) and then thermally oxidized in a diffusion furnace, for example, at temperature from 500 to 1200° C., thus forming the insulation film 55 made of zirconium oxide ($ZrO_2$) Next, as shown in FIG. 5(c), the lower electrode film 60 made of, for example, platinum and iridium is formed on the insulation film 55. In addition, though unillustrated, a crystal seed layer made of titanium or titanium oxide is formed on the lower electrode film 60, with a thickness of preferably about 2 to 200 nm and more preferably 5 nm. The titanium seed layer is formed by, for example, a known DC spattering method. This seed layer is formed to have a uniform thickness, but may also be formed to have an island-like shape when necessary.

A titanate film or titanate oxide film (contact layer: not shown) having a thickness of, for example, about 20 nm may be further formed between the lower electrode film 60 and the insulation film 55. Provision of the contact layer can improve adhesiveness between the insulation film 55 and the lower electrode film 60.

Next, as shown in FIG. 5(d), a piezoelectric precursor film 711' is deposited on the lower electrode film 60. The piezoelectric precursor film 711' is constructed as an amorphous film which will be crystallized by the following treatment so as to be a first piezoelectric layer 711. In this embodiment, a PZT precursor film is deposited by the sol-gel method.

The sol-gel method is for hydrolyzing a organometallic compound such as metal alkoxide using a solution system, and polycondensating the same. To be more specific, a solution (sol) 711" containing organometallic compound is applied on a substrate and then dried. The organometallic compound to be used includes alkoxido such as methoxide, ethoxide, propoxide and butoxide of metal which constructs an inorganic oxide, an acetate compound and the like. Mineral salt such as nitrate, oxalate, perchlorate and the like may also be used.

In this embodiment, a mixed solution (sol) of $Pb(CH_3COO)_2.3H_2O$, $Zr(t-OC_4H_9)_4$, $Ti(i-OC_3H_7)_4$ is prepared as a starting material of the PZT film. This mixed solution is applied by spin coating at a speed of 1500 rpm to have a thickness of 0.1 μm. At a stage where the solution is applied, each metal atoms composing PZT are diffused as organometallic complex.

After being applied, the solution is dried at certain temperature for a certain period of time, thus the solvent of the sol is evaporated. The drying temperature is set to, for example, 150° C. or higher but not exceeding 200° C., and 180° C. is preferred. The drying time is set to, for example, five minutes or longer but not exceeding 15 minutes, about 10 minutes of drying is preferred.

After dried, the sol film is degreased at certain temperature for a certain period of time in an atmosphere. Note that degreasing herein means releasing organic components of the sol film, for example, $NO_2$, $CO_2$, $H_2O$ and the like. It is preferred that the degreasing temperature be in a range from 300° C. or higher but not exceeding 500° C. This is because crystallization starts at temperature exceeding this range, and sufficient degreasing cannot be performed at temperature below this range. Preferably, the degreasing temperature is set to about 360 to 400° C. The degreasing time is set to, for example, five minutes or longer but not exceeding 90 minutes. This is because, when degreasing is performed for a period of time longer than the above range, crystallization starts only in the surface of the film without crystallizing inside of the film, and, when decreasing is performed for a period of time shorter than the range, sufficient degreasing cannot be performed. Preferably, degreasing is performed for about 10 minutes. Due to the degreasing, organic substances coordinating to metal are dissociated from metal and oxidization combustion reaction occurs therein. Thus, the organic substances are dispersed into air.

For the first degreasing, in other words, the degreasing for forming the first piezoelectric layer 711, a rate of temperature increase is set to 500° C./min or lower at least for the initial degreasing. By heating the sol film slowly at low rate of temperature increase, degreasing conditions become uniform, and thereby a number of small seed crystals are formed within the applied sol 711"". In order to control the rate of temperature increase to be 500° C./min or lower, the substrate with applied sol at room temperature is put on, for example, an aluminum plate at room temperature and then put on a hot plate heated to 400° C. Thus, the rate of temperature increase becomes about 430° C./min. The surface of the substrate where the sol is applied comes to the opposite side of the surface of the hot plate where the substrate is mounted. Therefore, heating starts from the substrate side, thereby realizing uniform and efficient degreasing.

The steps of application, drying and degreasing are repeated predetermined times, for example, twice, to form the first piezoelectric precursor film 711' (FIG. 5(e)) made of two gel layers. In this case, similarly to the initial degreasing step, it is preferred to heat the sol film at the rate of temperature increase of 500° C./min or lower for the second degreasing step. Note that the steps of application, drying and degreasing are conducted not only twice, but only once, or three times or more.

Next, the first piezoelectric precursor film 711' obtained in the aforementioned steps is crystallized by heat treatment, forming the first piezoelectric layer 711 (FIG. 5(f)). Although sintering conditions vary depending on a material, the first piezoelectric precursor film 711' is heated at 700° C. in an $O_2$ atmosphere for 30 minutes in this embodiment.

Heating equipment may be a diffusion furnace or rapid thermal annealing (RTA) equipment. As a result of the crystallization, the first piezoelectric layer 711 is formed. According to this embodiment, 80% or more of crystallized PZT exhibits plane orientation (100), and thereby the piezoelectric film having excellent piezoelectric properties can be formed. In addition, variation within the surface of the substrate is small and thus favorable properties can be obtained in the entire substrate.

Figure 7:
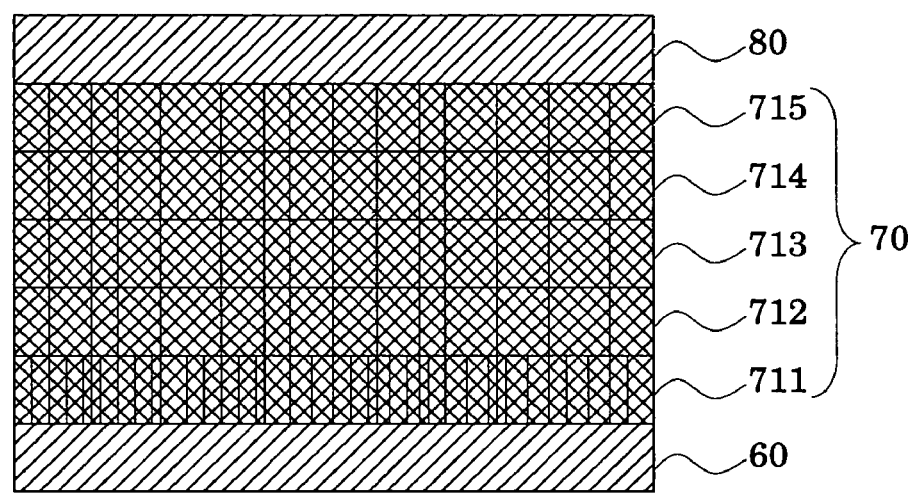
FIG. 7 is a partial cross-sectional view showing details of a layer construction of the piezoelectric element.

Next, steps similar to the above mentioned steps are repeated five times, thereby forming the piezoelectric film 70 with a predetermined thickness. These steps mentioned above include application, drying, degreasing of the sol that are repeated twice as well as crystallization thereafter. For example, when a film thickness of the sol which is applied once is about 0.1 μm, the thickness of the entire piezoelectric film 70 is about 1 μm. FIG. 7 is a partial cross-sectional view showing of a detailed layer construction of the piezoelectric element. A plurality of piezoelectric layers 712 to 715 are stacked on the first piezoelectric layer 711 which is formed in the first crystallization step.

In degreasing steps conducted after the initial crystallization, the rate of temperature increase is set to 1000° C./min or higher. In order to control the rate of temperature increase of 1000° C./min or higher, the substrate with the applied sol at room temperature is put, for example, directly on the hot plate heated to 400° C. Thus, the rate of temperature increase becomes about 25000° C./min.

Since the sol films are heated rapidly at the rate of temperature increase higher than that of the initial degreasing, the seed crystals are not easily formed within the sol films. Since the seed crystals are not easily formed, crystals grow in the following crystallization steps from previously crystallized piezoelectric crystals serving as nucleuses. This makes it possible to prevent the piezoelectric crystals from being discontinuous between upper and lower layers. As described so far, the sol films is heated while the rate of temperature increase for the initial decreasing is set lower than those for the following degreasing. Thus, column crystals having small particle sizes are formed in the first piezoelectric layer 711. In the second and following piezoelectric layers 712 to 715, column crystals are formed, which are continuous from the first piezoelectric layer 711 and have particle sizes larger than that of the first piezoelectric layer 711. In addition, according to this embodiment, 80% or more of crystallized PZT has a plane orientation (100) as affected by the layer below. Besides, variations within the surface of the substrate can be reduced.

Next, as shown in FIG. 6(a), the upper electrode film 80 is formed on the piezoelectric film 70 formed in the aforementioned manner. Specifically, platinum (Pt) is deposited by a spattering method as the upper electrode film 80 to have a thickness of about 0.05 μm.

Next, resist is applied onto the upper electrode film 80 by spin coating and then patterned by exposure and development along the position where the pressure generating chambers 12 should be formed. Using the remaining resist as a mask, the upper electrode film 80 and the piezoelectric film 70 are etched by ion milling or the like (FIG. 6(b)).

Thereafter, as shown in FIG. 6(c), the pressure generating chambers 12 are formed in the passage-forming substrate 10. Specifically, the mask film 51 provided on the surface of the passage-forming substrate 10 is patterned to have a predetermined shape. Using this mask film 51 as an etching mask, the passage-forming substrate 10 is etched to a predetermined depth, in this embodiment, until the passage-forming substrate 10 is penetrated, by dry etching using active gas such as parallel plate type ion etching. Thus, the pressure generating chambers 12 are formed. Note that remaining portions configure the compartment walls 11.

Finally, as shown in FIG. 6(d), the nozzle plate 20 is joined to the passage-forming substrate 10 using resin or the like. When joining the nozzle plate 20 to the passage-forming substrate 10, the nozzle plate 20 is positioned so that the nozzle orifices 21 are located corresponding to the spaces in the pressure generating chambers 12, respectively. In the steps described so far, the ink-jet recording head is formed.

Embodiment 2

Figure 8:
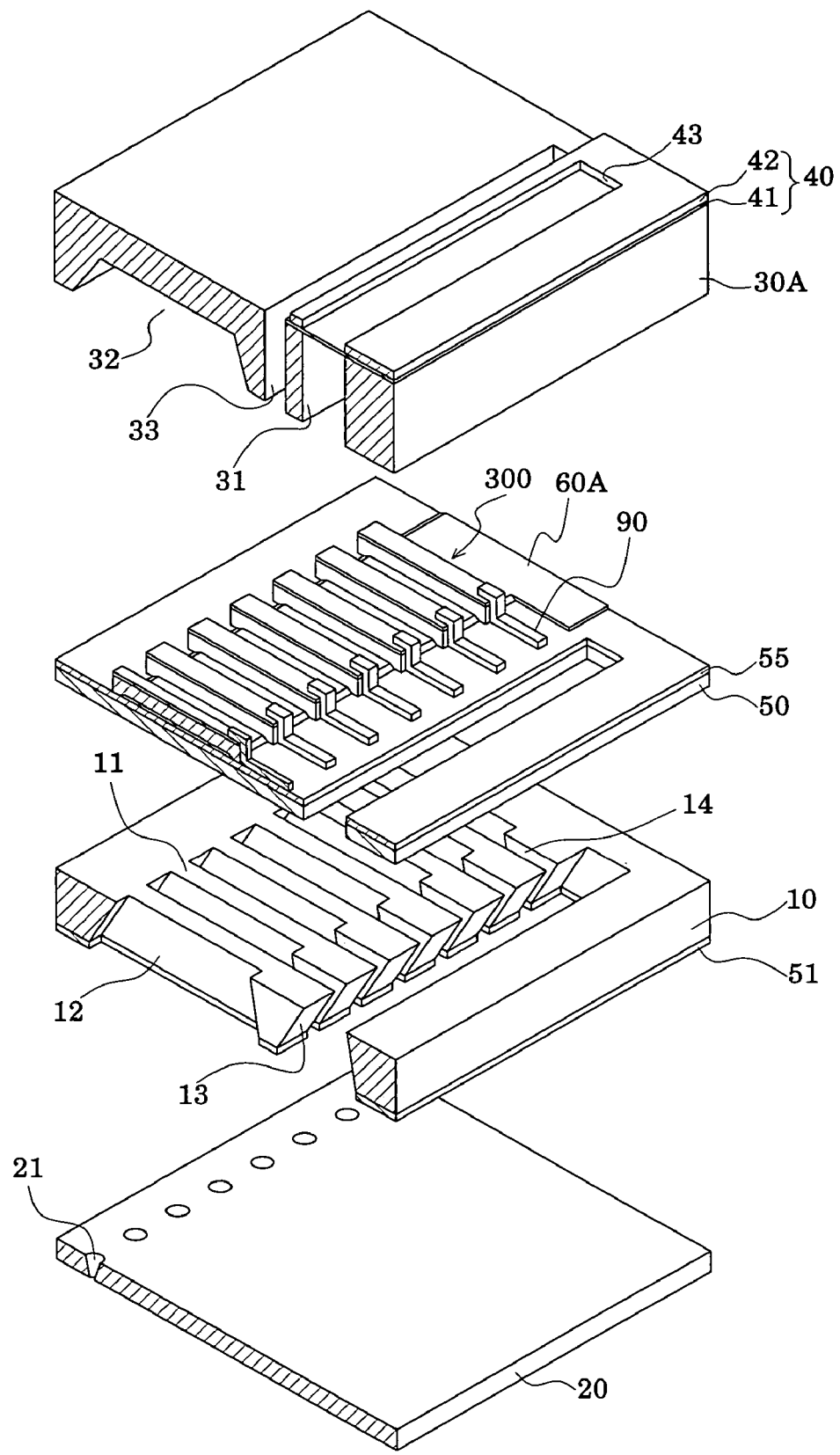
FIG. 8 is an exploded perspective view showing a recording head according to Embodiment 2.
Figure 9:
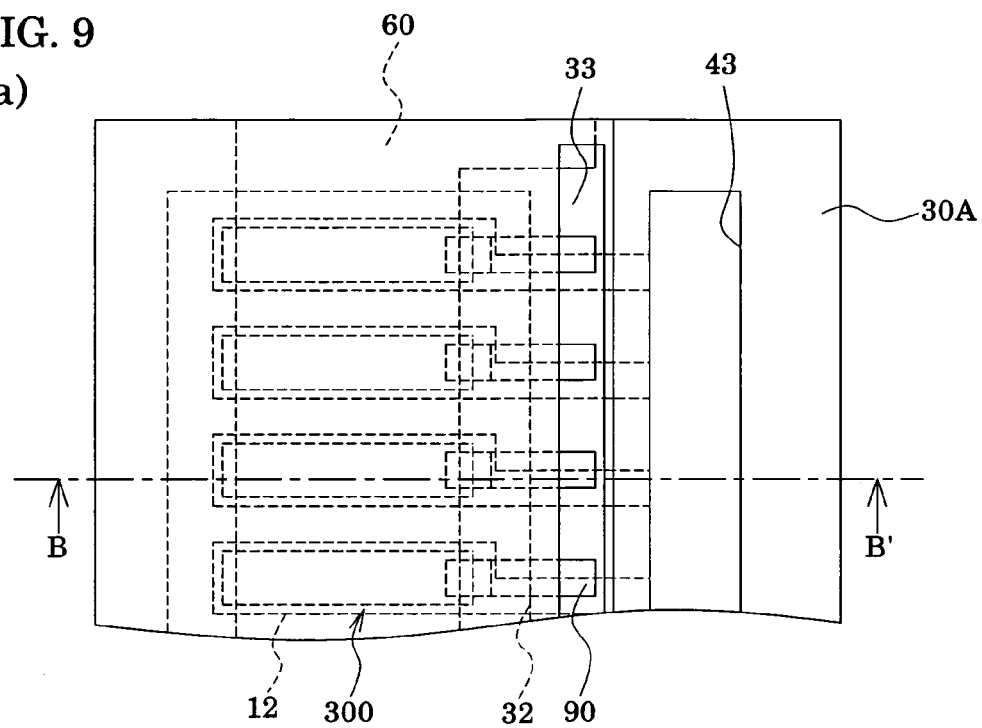
FIGS. 9(a) and 9(b) are a plan view and a cross-sectional view, respectively, of the recording head according to Embodiment 2.
Figure 9:
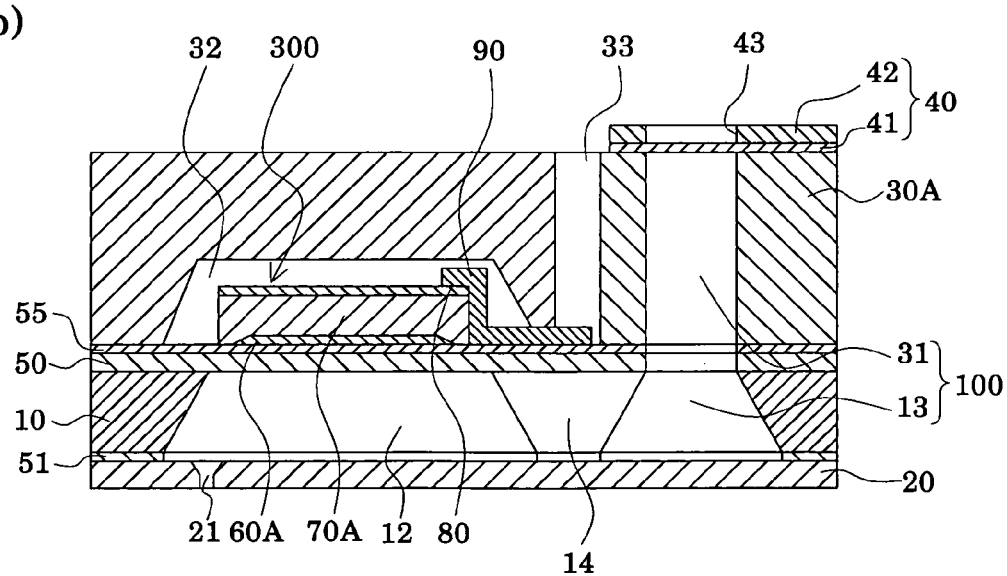
Figure 10:
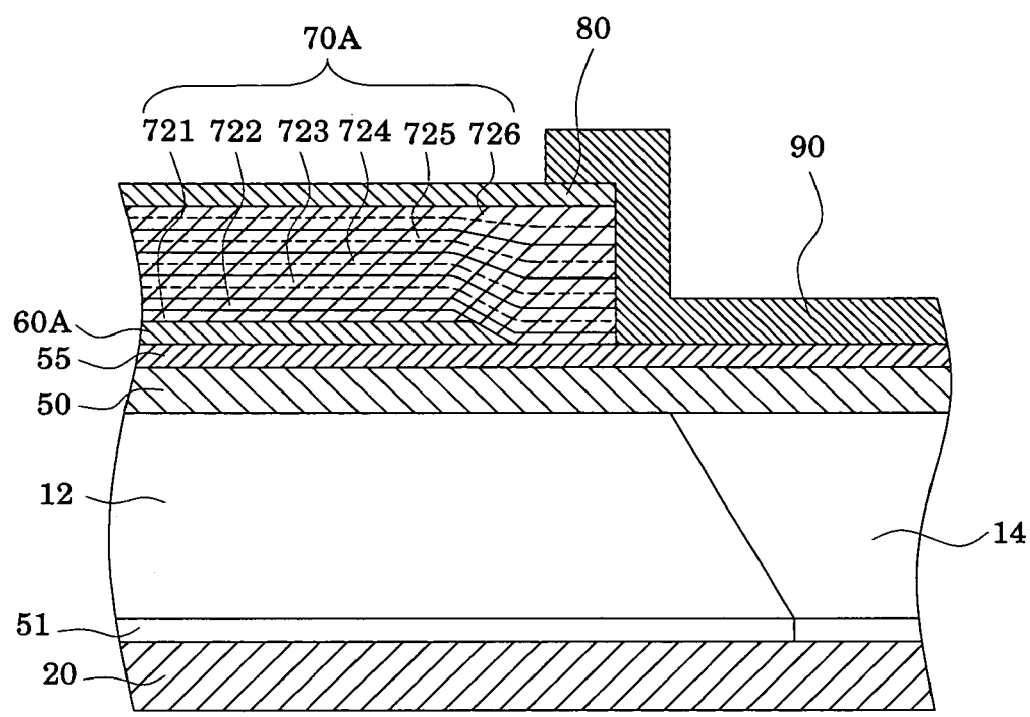
FIG. 10 is a cross-sectional view of the recording head according to Embodiment 2.

FIG. 8 is an exploded perspective view schematically showing an ink-jet recording head according to Embodiment 2 of the present invention. FIGS. 9(a) and 9(b) are a plan view of FIG. 8 and a cross-sectional view taken along the line B-B', respectively. FIG. 10 is a schematic view showing a layer construction of a piezoelectric element. Note that the same members as those described in Embodiment 1 are denoted by the same referential numerals, and duplicated description is thus omitted.

This embodiment is another example of the layer construction of the piezoelectric element. Specifically, as shown in FIGS. 8 to 10, the a lower electrode film 60A constructing the piezoelectric element 300 is patterned in the vicinities of both edges of each pressure generating chamber 12 and continuously provided along a direction in which the pressure generating chamber 12 is provided. Moreover, in this embodiment, each end face of the lower electrode film 60A in a region facing each of the pressure generating chambers 12 is inclined at a predetermined angle with respect to the surface of a passage-forming substrate 10.

The piezoelectric film 70A is provided independently for each of the pressure generating chambers 12 and is constructed by a plurality of layers. In this embodiment, these layers are six piezoelectric layers 721 to 726 as shown in FIG. 10. A first piezoelectric layer 721, which is the lowermost layer amongst the six layers, is provided only on the lower electrode film 60A. Additionally, each end faces of the first piezoelectric layer 721 has an inclined plane which is continuous from each end plane of the lower electrode film 60A. The second to sixth piezoelectric layers 722 to 726 formed on the first piezoelectric layer 721 are provided on the first piezoelectric layer 721 through an insulation layer 55, covering the inclined planes of the first piezoelectric layer 721 and the lower electrode film 60A.

Herein, the first piezoelectric layer 721 and the second piezoelectric layer 722 which is formed on the first piezoelectric layer 721, are formed to have crystal densities higher than those of the rest of the layers, third to sixth layers 723 to 726. Specifically, the third to sixth layers 723 to 726 in a higher portion of the piezoelectric film 70A are provided with column crystals having larger sizes than those of the first and second piezoelectric layers 721 and 722 in a lower portion of the piezoelectric film 70A. Accordingly, orientation and denseness of crystals of the respective piezoelectric layers 721 to 726 are improved, and thereby the film quality of the piezoelectric film 70A can be improved significantly.

Furthermore, it is preferred that the first and second piezoelectric layers 721 and 722 be formed to be thinner than the rest of the layers, third to sixth piezoelectric layers 723 to 726. For example, in this embodiment, the first and second piezoelectric layers 721 and 722 are formed with a thickness of about 0.1 μm, respectively, and the third to sixth piezoelectric layers 723 to 726 are formed with a thickness of about 0.2 μm, respectively.

Note that, in this embodiment, each upper electrode film 80 provided on each of the piezoelectric film 70A is connected to a lead electrode 90 made of, for example, gold (Au) or the like, extending to the surface of the insulation film 55.

In this embodiment, a reservoir forming plate 30 joined to the passage-forming substrate 10 is provided with a piezoelectric element holding portion 32 in a region facing the piezoelectric element 300. The piezoelectric element holding portion 32 ensures a space which does not interfere with movement of the piezoelectric elements 300 and is capable of sealing the space. Each of the piezoelectric elements 300 is sealed within the piezoelectric element holding portion 32 which is blocked from the external environment. In addition, in a region between the reservoir portion 31 and the piezoelectric element holding portion 32 of the reservoir forming plate 30A, a through hole 33 is provided penetrating the reservoir forming plate 30A in a thickness direction thereof. The vicinity of the end of the lead electrode 90 drawn out of each of the piezoelectric elements 300 is exposed within the through hole 33.

Figure 11:
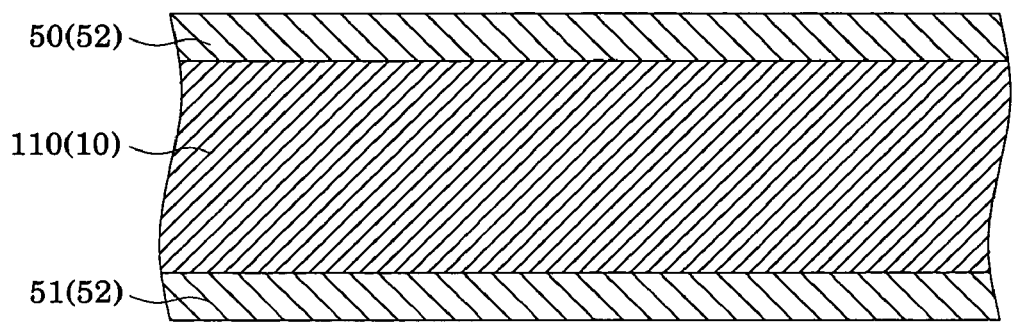
FIGS. 11(a) to 11(c) are cross-sectional views of the recording head, showing manufacturing steps thereof according to Embodiment 2.
Figure 11:
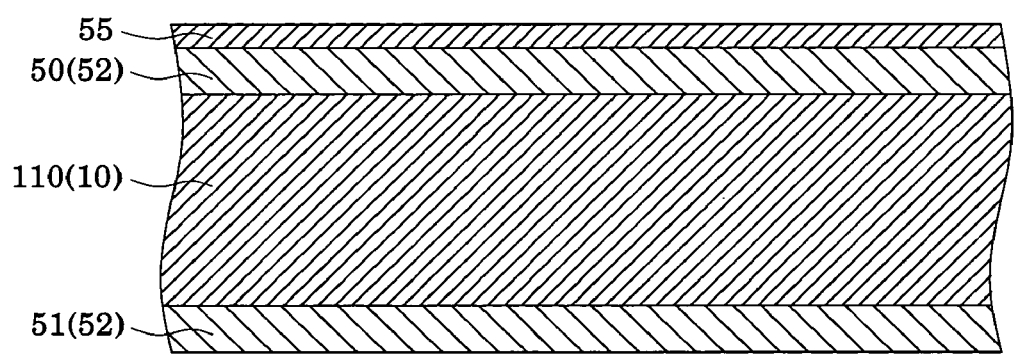
Figure 11:
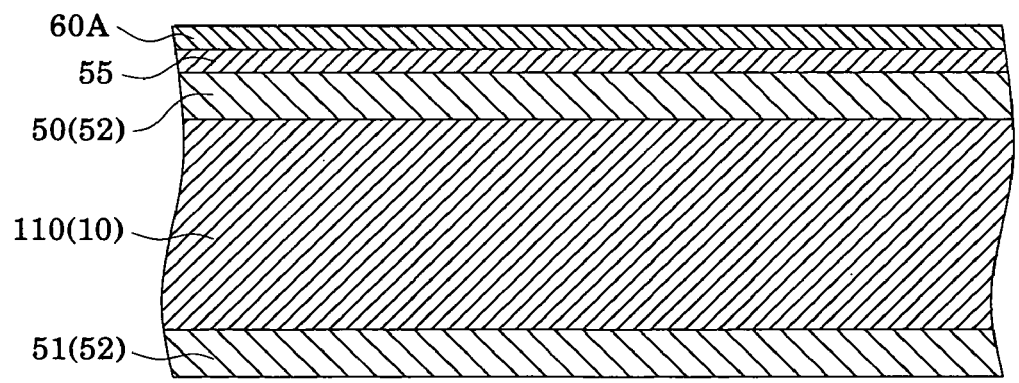

Below is a description regarding a manufacturing method of the ink-jet recording head according to this embodiment, in particular, a manufacturing method of the piezoelectric element. FIGS. 11(*a*) to 15(*b*) are cross-sectional views of the ink-jet recording head, showing manufacturing steps thereof according to this embodiment.

Figure 12:
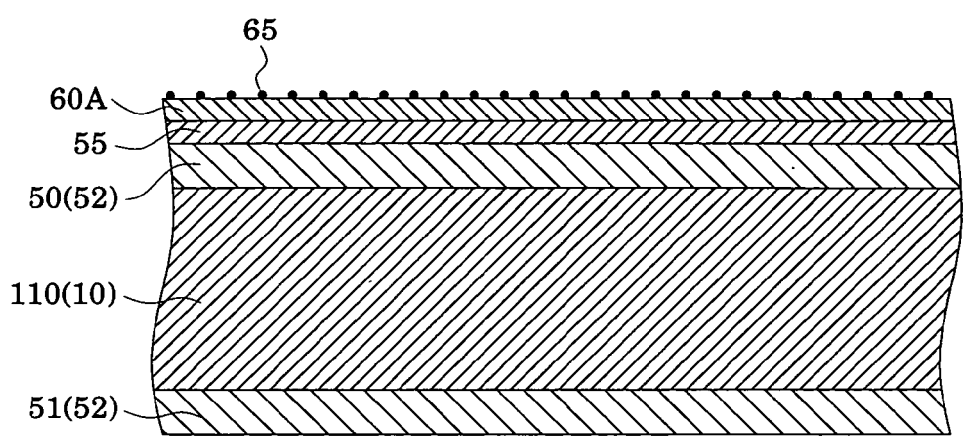
FIGS. 12(a) to 12(c) are cross-sectional views of the recording head, showing manufacturing steps thereof according to Embodiment 2.
Figure 12:
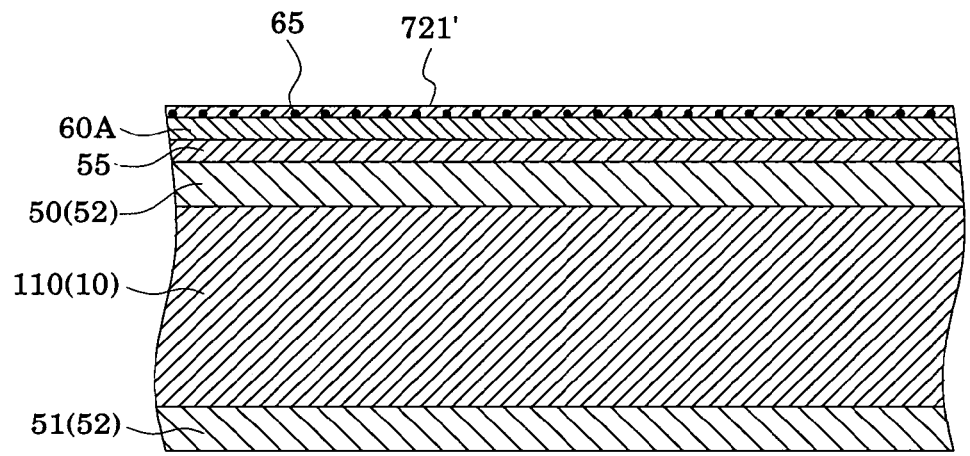
Figure 12:
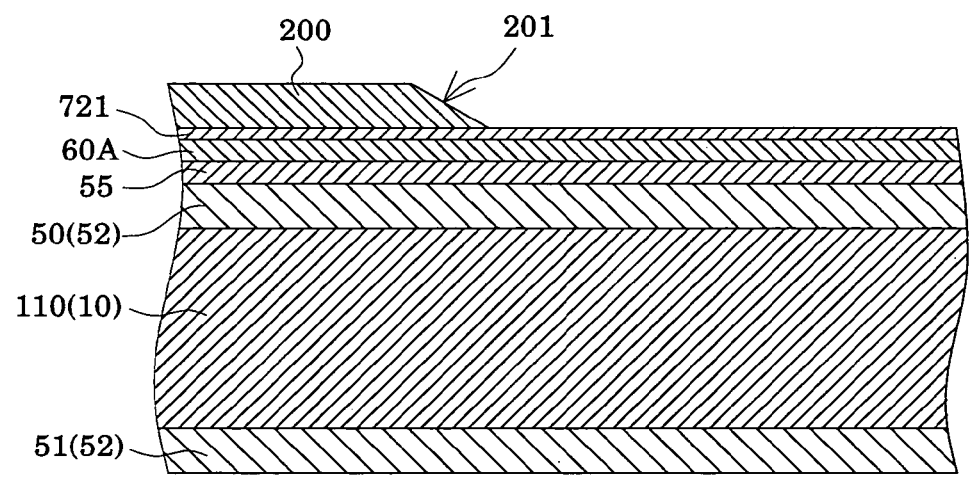

First of all, as shown in FIGS. 11(*a*) to 11(*c*), a silicon dioxide film 52 which will be an elastic film 50 and a mask film 51, the insulation film 55 and the lower electrode film 60A are formed on a silicon wafer 110, similarly to Embodiment 1. Next, as shown in FIG. 12(*a*), crystal seeds (layer) 65 made of titanium or titanium oxide are formed on the lower electrode film 60A. Note that, in this embodiment, the crystal seeds are formed to have island-like shapes. Next, as shown in FIG. 12(*b*), a piezoelectric precursor film 721' that is not yet crystallized is deposited to have a predetermined thickness which is about 0.1 μm in this embodiment. Note that the piezoelectric precursor film 721' is formed by a sol-gel method, in other words, by applying a solution (sol) containing an organometallic compound to have a predetermined thickness, followed by drying and degreasing of the solution.

Here, in this embodiment, a rate of temperature increase while degreasing the piezoelectric precursor film 721' is set to be lower than those for the third to sixth piezoelectric layers 723 to 726 formed in the following steps. To be more specific, it is preferred that the rate of temperature increase while degreasing be, for example, about 1.5 to 2° C./second when raising temperature from 250 to 300° C. In this way, many crystal nucleuses can be formed in the piezoelectric film 721', thereby improving orientation and denseness of the first piezoelectric layer 721 obtained after a burning step described below.

Thereafter, the silicon wafer 110, on which the piezoelectric precursor film 721' is formed, is inserted into a predetermined dispersion furnace and the piezoelectric precursor film 721' is burned at high temperature of about 700° C. to be crystallized. Consequently, the first piezoelectric layer 721 is formed as the closest layer to the lower electrode film 60A.

Next, the lower electrode film 60A and the first piezoelectric layer 721 are simultaneously patterned. Specifically, as shown in FIG. 12(*c*), resist is applied on the first piezoelectric layer 721, and then exposed and developed using a mask, thus forming a resist film 200 having a predetermined pattern. Here, the resist is formed by, for example, applying negative resist by a spin coating method or the like. Thereafter, the negative resist is exposed, developed and baked using a predetermined mask, thereby forming the resist film 200. As a matter of course, it is possible to use positive resist instead of negative resist. In addition, in this embodiment, each end face 201 of the resist film 200 is formed to incline at a predetermined angle. The inclination angle of the end face 201 becomes smaller as a post bake is conducted for a longer period of time. The inclination angle may also be controlled by excessive exposure.

Figure 13:
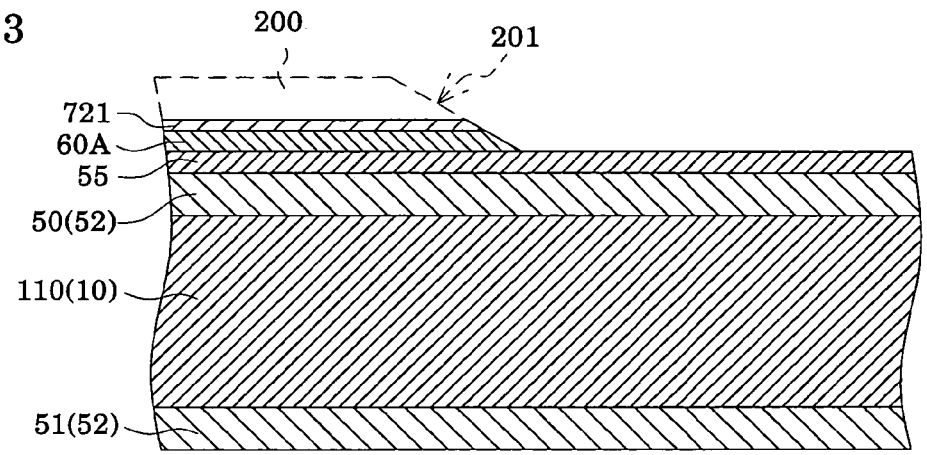
FIGS. 13(a) to 13(c) are cross-sectional views of the recording head, showing manufacturing steps thereof according to Embodiment 2.
Figure 13:
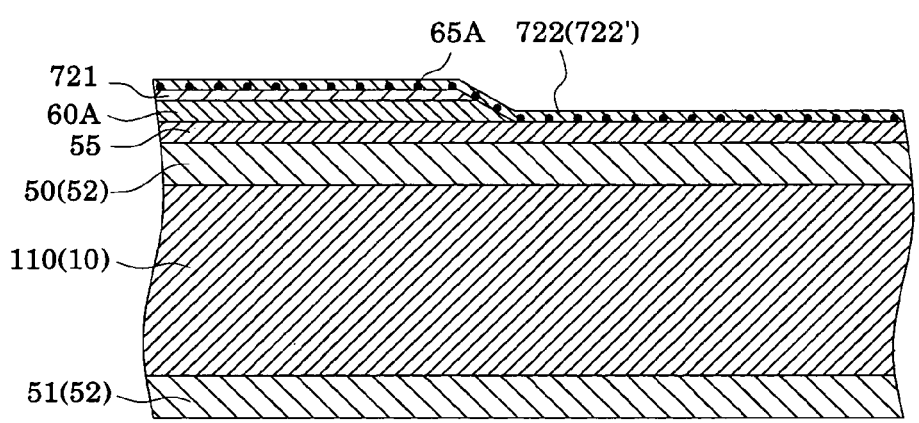
Figure 13:
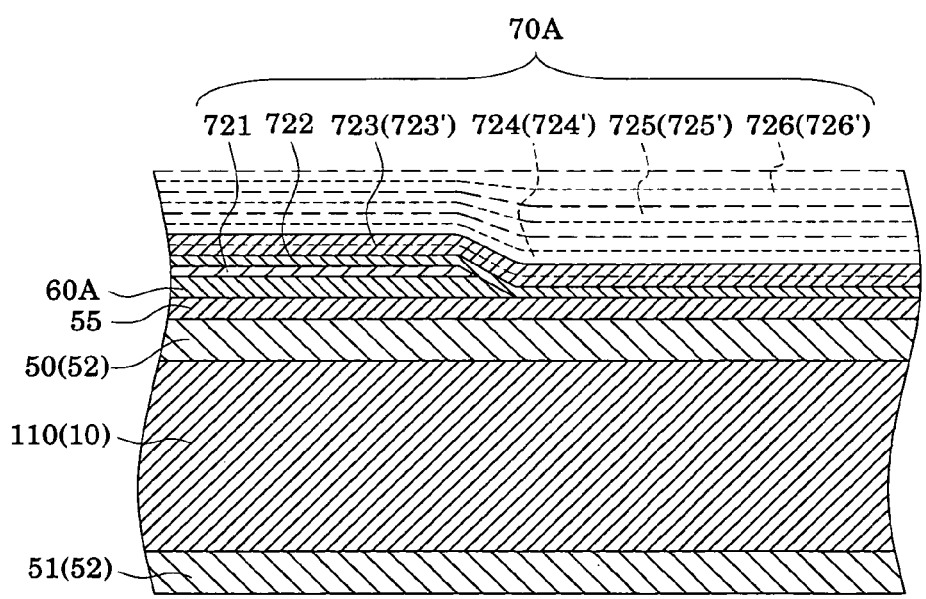

Thereafter, as shown in FIG. 13(*a*), the lower electrode film 60A and the first piezoelectric layer 721 are patterned through the resist film 200 by ion milling. At this time, the lower electrode film 60A and the first piezoelectric layer 721 are patterned along each of the inclined end faces 201 of the resist film 200. Thus, end faces of the lower electrode film 60A and the first piezoelectric layer 721 are inclined at a predetermined angle to a vibration plate. Since the end faces of the lower electrode film 60A and the first piezoelectric layer 721 are inclined, the rest of piezoelectric layers can be formed with favorable film qualities on the first piezoelectric layer 721.

Next, as shown in FIG. 13(*b*), crystal seeds (layer) 65A are formed over the entire surface of the silicon wafer 110 including the first piezoelectric layer 721. Thereafter, the piezoelectric precursor film 722' is formed by the spin coating method or the like to have a predetermined thickness, which is about 0.1 μm in this embodiment. The piezoelectric precursor film 722' is then dried, degreased and burned, thus forming the second piezoelectric layer 722. Note that it is preferred that degreasing of the piezoelectric precursor film 722', which becomes the second piezoelectric layer 722, be conducted with a relatively low rate of temperature increase, similarly to the case of the first piezoelectric layer 721. In this way, many crystal nucleuses can be formed in the piezoelectric precursor film 722'. In other words, the second piezoelectric layer 722, in which a number of favorable crystal nucleuses are approximately uniformly formed, is obtained from a region facing the lower electrode film 60A through a region facing the insulation film 55.

Next, as shown in FIG. 13(*c*), a piezoelectric precursor film 723' is formed on the second piezoelectric layer 722, to have a predetermined thickness, which is 0.2 μm in this embodiment. Since about 0.1 μm is the thickness of the piezoelectric precursor film which is applied once, application, drying, and degreasing are carried out twice in this embodiment to obtain a piezoelectric precursor film 723' with a desired thickness. Thereafter, the piezoelectric precursor film 723' is burned to be crystallized, forming the third piezoelectric layer 723. As described above, the steps of application, drying and degreasing that are conducted twice to form the piezoelectric precursor film, and the step of burning the resultant piezoelectric precursor film are respectively carried out a plurality of times, which is four times in this embodiment. Thus, the third to sixth piezoelectric layers 723 to 726 are formed, and thereby forming the piezoelectric film 70A which is constructed by the plurality of piezoelectric layers 721 to 726 and has a thickness of about 1 μm.

Note that, as mentioned earlier, a relatively high rate of temperature increase is preferred when degreasing the piezoelectric precursor films 723' to 726', which will be the third to sixth piezoelectric layers 723 to 726. For example, in this embodiment, the rate of temperature increase for degreasing the piezoelectric precursor films 723' to 726' is set to be higher than those for degreasing the piezoelectric precursor films 721' and 722' which will be the first and second piezoelectric layers 721 and 722.

Figure 14:
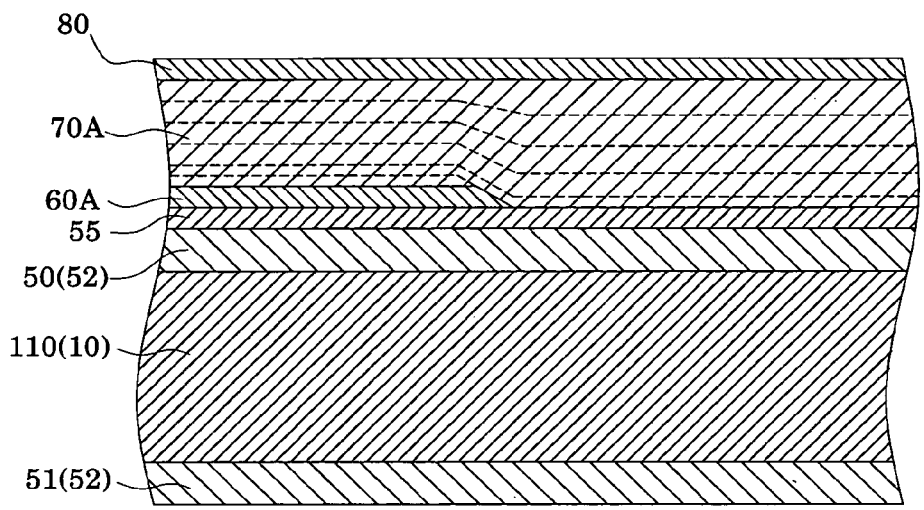
FIGS. 14(a) and 14(b) are cross-sectional views of the recording head, showing manufacturing method thereof according to Embodiment 2.
Figure 14:
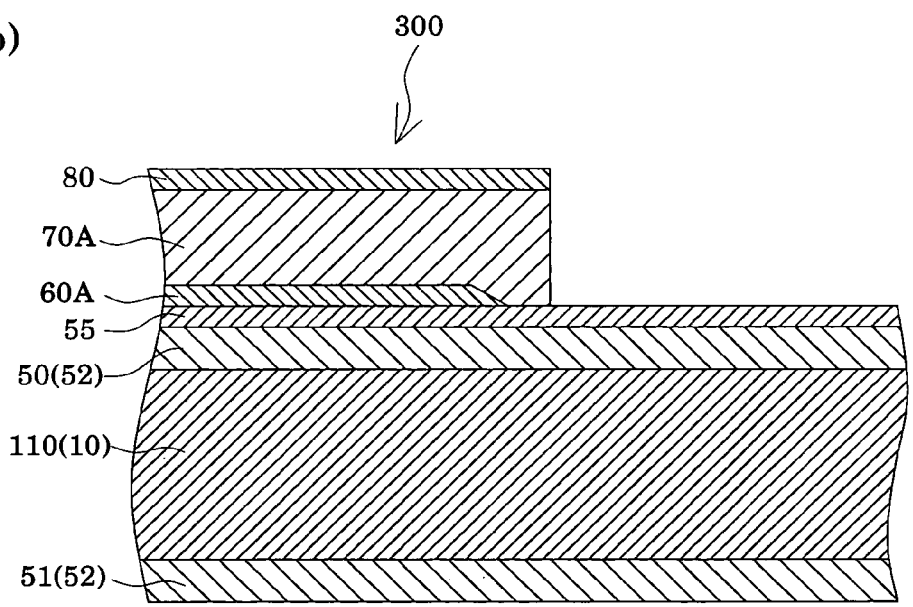

After the piezoelectric film 70A is formed in the aforementioned manner, the upper electrode film 80 is laminated as shown in FIG. 14(*a*). The piezoelectric film 70A and the upper electrode film 80 are patterned within a region facing each of the pressure generating chambers 12, thus forming the piezoelectric element 300 (FIG. 14(*b*)).

As set forth in the foregoing, in this embodiment, when forming the first and second piezoelectric layers 721 and 722 constructing the piezoelectric film 70A, degreasing of the piezoelectric precursor films 721' and 722' is conducted with a relatively low rate of temperature increase. When forming the rest of third to six piezoelectric layers 723 to 726, degreasing of the piezoelectric precursor films 723' to 726' is conducted with a relatively high rate of temperature increase. Accordingly, a number of crystal nucleuses are formed in the first and second piezoelectric layers 721 and 722, and thus denseness and orientation of crystals are significantly improved. The crystals of the rest of third to six piezoelectric layers 723 to 726 are favorably formed continuously from the crystals of the second piezoelectric layer 722, serving as nucleuses. Therefore, the film quality of the piezoelectric film 70A is improved and also becomes approximately uniform over the entire piezoelectric film 70A. Thus, when a voltage is applied to the piezoelectric element 300, favorable displacement properties can be obtained. In addition, even if a relatively high voltage is applied to the piezoelectric element 300, the piezoelectric film 70A is not broken and thereby the piezoelectric element 300 with excellent reliability can be obtained.

Figure 15:
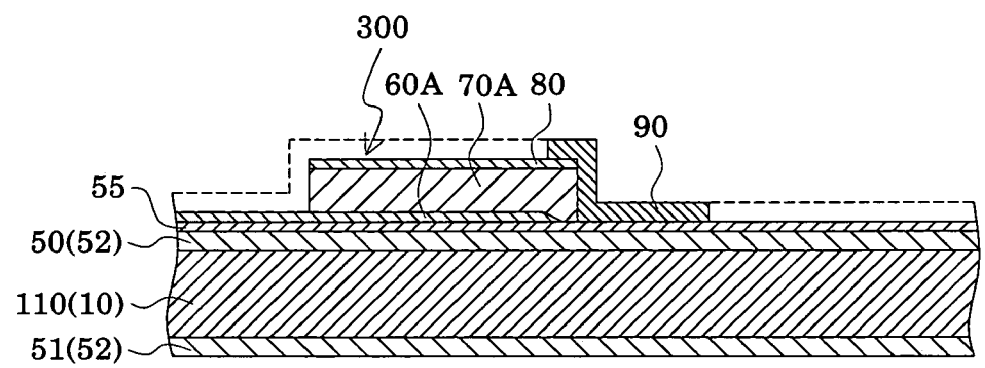
FIGS. 15(a) and 15(b) are cross-sectional views of the recording head, showing manufacturing method thereof according to Embodiment 2.
Figure 15:
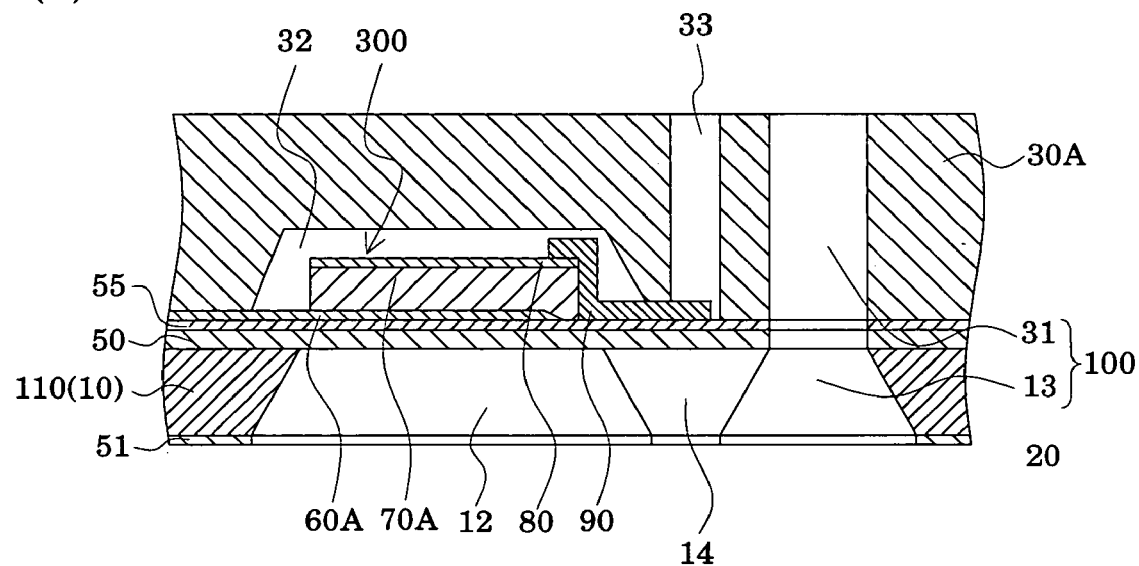

Thereafter, as shown in FIG. 15(*a*), a metal layer made of gold (Au) is formed over the entire surface of the silicon wafer 110. The metal layer is then patterned for each of the piezoelectric elements 300 through, for example, a mask pattern (not shown) made of resist or the like, thus forming the lead electrode 90. After forming the layers in the foregoing manner, the reservoir forming plate 30A is joined to the silicon wafer 110, and then the pressure generating chamber 12 and the like is formed, as shown in FIG. 15(*b*). In this embodiment, anisotropic etching is performed on the silicon wafer 110, forming each of the pressure generating chambers 12. Thereafter, the aforementioned nozzle plate 20 and the compliance plate 40 are adhered to the silicon wafer 110 so that they are integrated. The silicon wafer 110 is divided into the passage-forming substrates 10, each having a chip size. Thus, the ink-jet recording head is produced.

Note that, in this embodiment the lower electrode film 60A is, though not limited, continuously formed in a region corresponding to each of the pressure generating chambers 12 which are arrayed side by side. It may be possible, for example, that the lower electrode film is formed to have a comb shape so that the lower electrode film in the region facing each of the pressure generating chambers becomes substantially independent.

Embodiment 3

Figure 16:
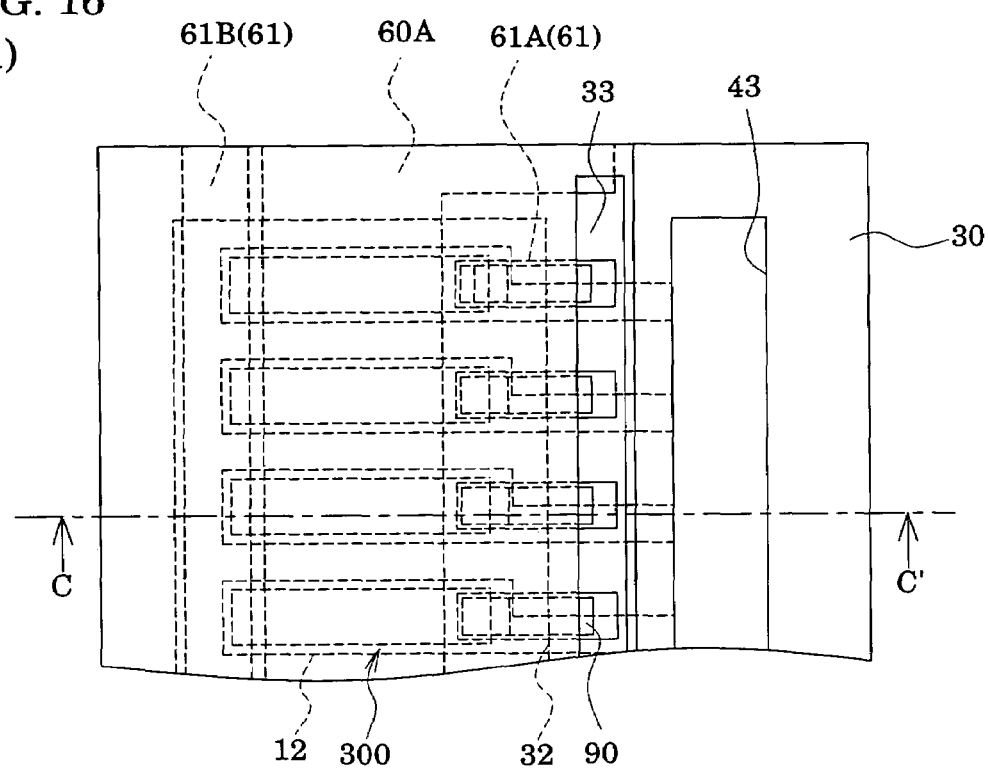
FIGS. 16(a) and 16(b) are a plan view and a cross-sectional view, respectively, of a recording head according to Embodiment 3.
Figure 16:
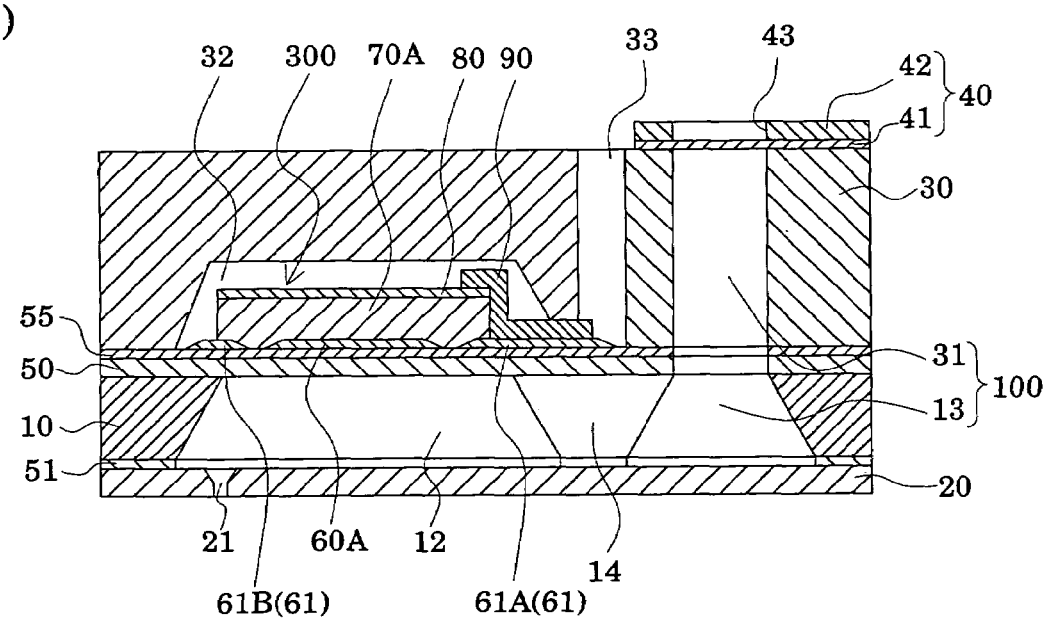

FIGS. 16(*a*) and 16(*b*) are a plan view and a cross-sectional view of an ink-jet recording head according to Embodiment 3.

This embodiment is an example in which metal layers are provided on a vibration plate in the vicinities of edges of a piezoelectric film 70A. This construction is same as that of Embodiment 2 except provision of the metal layers. Specifically, as shown in FIGS. 16(*a*) and 16(*b*), metal layers 61 are provided in the vicinities of both edges of the piezoelectric film 70A in a longitudinal direction thereof. The metal films 61 are formed in the same layer of the lower electrode film 60A, but are electrically disconnected from the lower electrode film 60A. The piezoelectric film 70A is provided, extending over a part of each metal layers 61.

Note that, in this embodiment, a metal film 61A is provided in the vicinity of the edge of the piezoelectric film 70A on the side of the lead electrode 90. The metal film 61A is also provided separately for each of the piezoelectric elements, and the lead electrode 90 extends over the metal layer 61A. Meanwhile, a metal layer 61B is provided in the vicinity of the edge of the piezoelectric film 70A on the opposite side of the lead electrode 90. The metal layer 61B is continuously provided in a region corresponding to the plurality of piezoelectric elements 300.

In this construction, the piezoelectric precursor film can be heated approximately uniformly when burned. Thus, the piezoelectric film 70A having uniform piezoelectric properties can be formed. Specifically, the insulation film 55 made of zirconium oxide has low absorptivity of infrared rays in comparison with the lower electrode film 60A. Thus, the region in which the lower electrode film 60A has not been formed has slow increase of temperature while burning. Therefore, piezoelectric properties may not be uniform in the region corresponding to the lower electrode film 60A of the piezoelectric film 70A and the other regions. However, in this embodiment, the metal layers 61A and 61B are provided in regions corresponding to both edges of the piezoelectric film 70A. Thus, the piezoelectric precursor film can be uniformly heated while burning, thereby forming the piezoelectric film 70A having uniform piezoelectric properties as a whole.

Another Embodiment

The embodiments of the prevent invention have been described so far, but the construction of the present invention is not limited thereto.

For example, in the foregoing embodiments, the ink-jet recording head was described as an example. However, the present invention may be applied to various liquid jet heads such as: a color material jet head used for manufacturing color filters of a liquid crystal display and the like; an electrode material jet head used for forming electrodes of an organic EL display, a field emission display (FED) and the like; and a bio-organic matter jet head used for manufacturing biochips. Further, as a matter of course, the piezoelectric element of the present invention may be applied not only to a liquid jet head but to any devices as long as actuators in a flexural vibration mode are used therein.

INDUSTRIAL APPLICABILITY

According to the present invention, a manufacturing method of the piezoelectric element is provided. In the piezoelectric element, desired and favorable crystallinity can be obtained and the uniformity of the piezoelectric properties within the surface thereof can be improved. Thus, the piezoelectric element having the piezoelectric properties with improved uniformity can be provided. In addition, obtained is the highly reliable piezoelectric element in which the piezoelectric film is not broken even if a relatively high voltage is applied thereto.

The invention claimed is:

1. A piezoelectric element comprising:
a lower electrode,
a piezoelectric film formed on the lower electrode, and
an upper electrode formed on the piezoelectric film,
wherein the piezoelectric film includes a lower layer portion having column crystals, and an upper layer portion having column crystals which are continuous from the column crystals in the lower layer portion and having sizes larger than the column crystals in the lower layer portion.

2. The piezoelectric element according to claim 1,
wherein the lower electrode is patterned to have a predetermined shape, a first piezoelectric layer, which is a lowermost layer of a plurality of piezoelectric layers constructing the piezoelectric film, is formed only on the lower electrode, and remaining layers of the plurality of piezoelectric layers are formed covering end faces of the lower electrode and the first piezoelectric layer, and the first piezoelectric layer and a second piezoelectric layer are formed directly on the first piezoelectric layer to construct the lower layer portion.

3. The piezoelectric element according to claim 2, wherein a thickness of each of the first and second piezoelectric layers is thinner than that of each of the remaining piezoelectric layers.

4. The piezoelectric element according to claim 2, wherein the end faces of the lower electrode and the first piezoelectric layer are inclined at a predetermined angle with respect to surfaces thereof.

5. The piezoelectric element according to claim 2, wherein metallic layers, which are electrically disconnected from the lower electrode, are provided in vicinities of edges of the piezoelectric film.

6. A liquid-jet head, comprising the piezoelectric element according to any one of claims 1 to 5 as a driving source of liquid ejection.

* * * * *